United States Patent
Mazraehno et al.

(10) Patent No.: US 10,510,916 B2
(45) Date of Patent: Dec. 17, 2019

(54) COMPONENT FOR DETECTING UV RADIATION AND METHOD FOR PRODUCING A COMPONENT

(71) Applicant: OSRAM Opto Semiconductors GmbH, Regensburg (DE)

(72) Inventors: Mohammad Tollabi Mazraehno, Regensburg (DE); Peter Stauß, Regensburg (DE); Alvaro Gomez-Iglesias, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/306,522

(22) PCT Filed: May 26, 2017

(86) PCT No.: PCT/EP2017/062784
§ 371 (c)(1),
(2) Date: Nov. 30, 2018

(87) PCT Pub. No.: WO2017/207441
PCT Pub. Date: Dec. 7, 2017

(65) Prior Publication Data
US 2019/0221703 A1      Jul. 18, 2019

(30) Foreign Application Priority Data

May 31, 2016   (DE) .................. 10 2016 110 041

(51) Int. Cl.
*H01L 31/105* (2006.01)
*H01L 31/0304* (2006.01)
*H01L 31/18* (2006.01)

(52) U.S. Cl.
CPC ...... *H01L 31/105* (2013.01); *H01L 31/03048* (2013.01); *H01L 31/1848* (2013.01); *H01L 31/1852* (2013.01)

(58) Field of Classification Search
CPC ............. H01L 31/105; H01L 31/03048; H01L 31/1848; H01L 31/1852
(Continued)

(56) References Cited

U.S. PATENT DOCUMENTS 6,495,852 B1    12/2002 Mouri
2011/0180854 A1  7/2011 Ramdani
(Continued)

FOREIGN PATENT DOCUMENTS

CN    101188256 A    5/2008
CN    102214705 B    4/2013

OTHER PUBLICATIONS

Islam, R. et al., "Strain Relaxation and Improvement of Epi-Layer Quality Using Step-graded Layers for MOVPE InxGa1—xN (x~0. 4)," IEEE/OSA/IAPR International Conference on Informatics, Electronics & Vision, ICIEV, 2012, 4 pages.
(Continued)

*Primary Examiner* — Elias Ullah
(74) *Attorney, Agent, or Firm* — Slater Matsil, LLP

(57) ABSTRACT

A component for detecting UV radiation and a method for producing a component are disclosed. In an embodiment a component includes a semiconductor body including a first semiconductor layer, a second semiconductor layer and an intermediate active layer located therebetween, wherein the semiconductor body is based on $Al_mGa_{1-n-m}In_nN$ with $0 \leq n \leq 1$, $0 \leq m \leq 1$ and $n+m<1$, wherein the first semiconductor layer is n-doped, wherein the second semiconductor layer is p-doped, wherein the active layer is formed with respect to its material composition in such a way that during operation
(Continued)

of the component, arriving ultraviolet radiation is absorbed by the active layer for generating charge carrier pairs, wherein the active layer is relaxed with respect to its lattice constant, and wherein the first semiconductor layer is strained with respect to its lattice constant.

19 Claims, 5 Drawing Sheets

(58) Field of Classification Search
USPC .......................................................... 257/458
See application file for complete search history.

(56) References Cited

U.S. PATENT DOCUMENTS

2012/0104360 A1   5/2012   Hardy et al.
2015/0364641 A1   12/2015  Bergbauer et al.

OTHER PUBLICATIONS

McClintock, R. et al., "High Quantum Efficiency AlGaN Solar-Blind p-i-n Photodiodes," Applied Physics Letters, vol. 84, No. 8, Feb. 23, 2004, 3 pages.
Yang, L.H. et al., "Polarization Enhanced Photoresponse of AlGaN p-i-n Photodetectors," Phys. Status Solidi A: Applications and Materials Science, vol. 212, No. 3, Mar. 1, 2015, 5 pages.

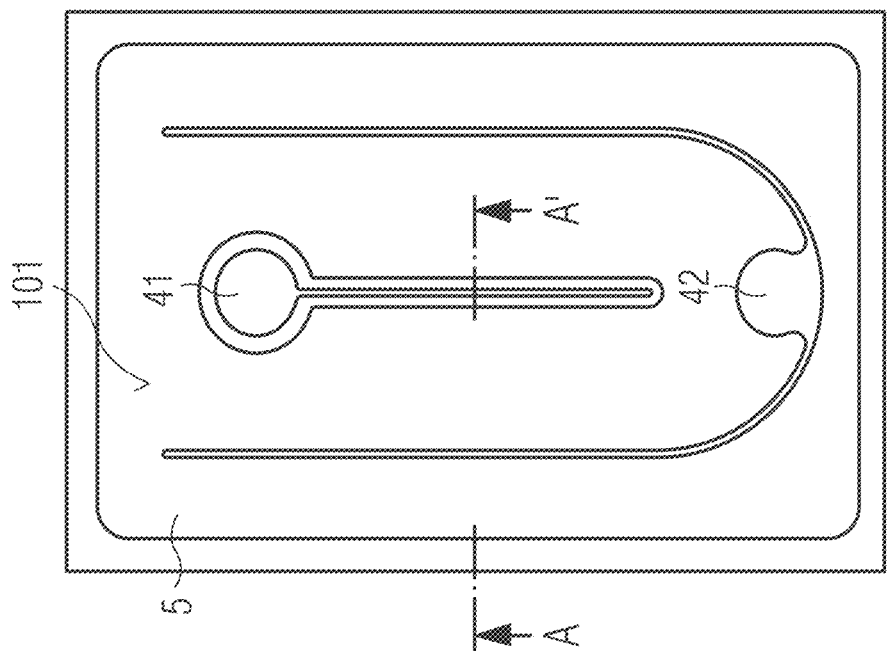
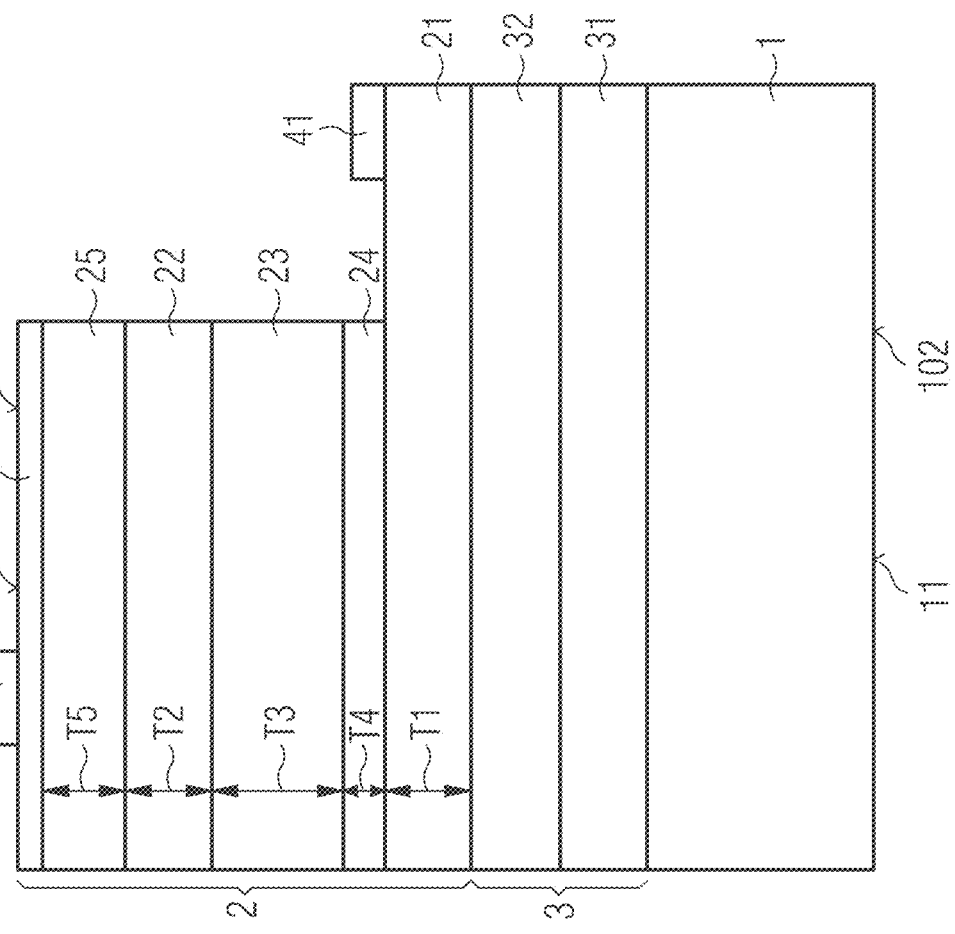

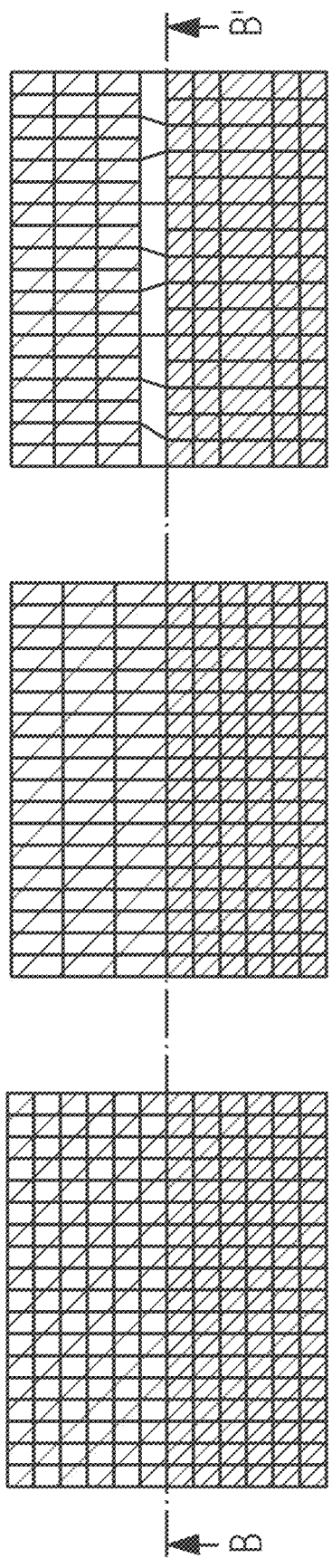

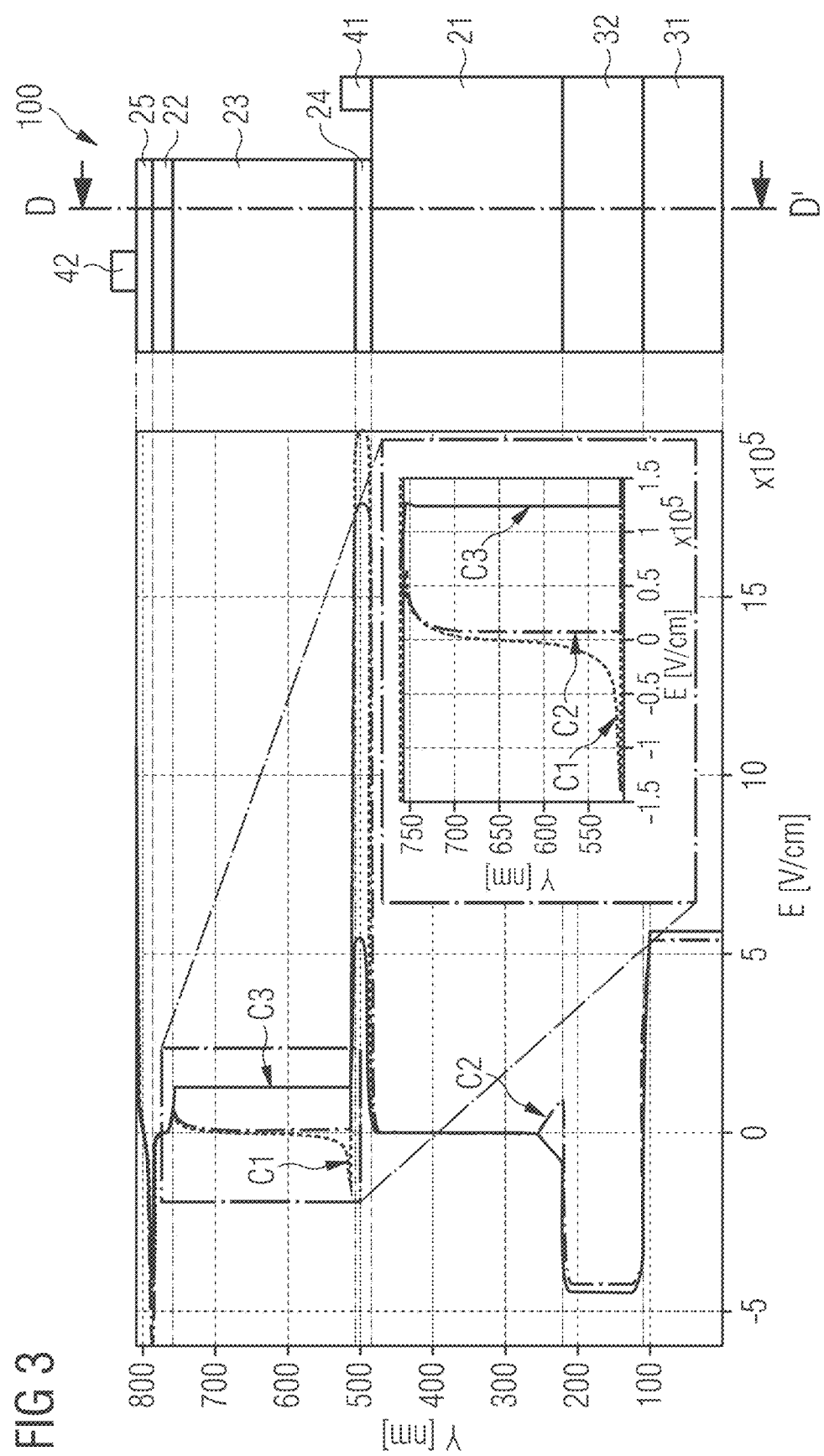

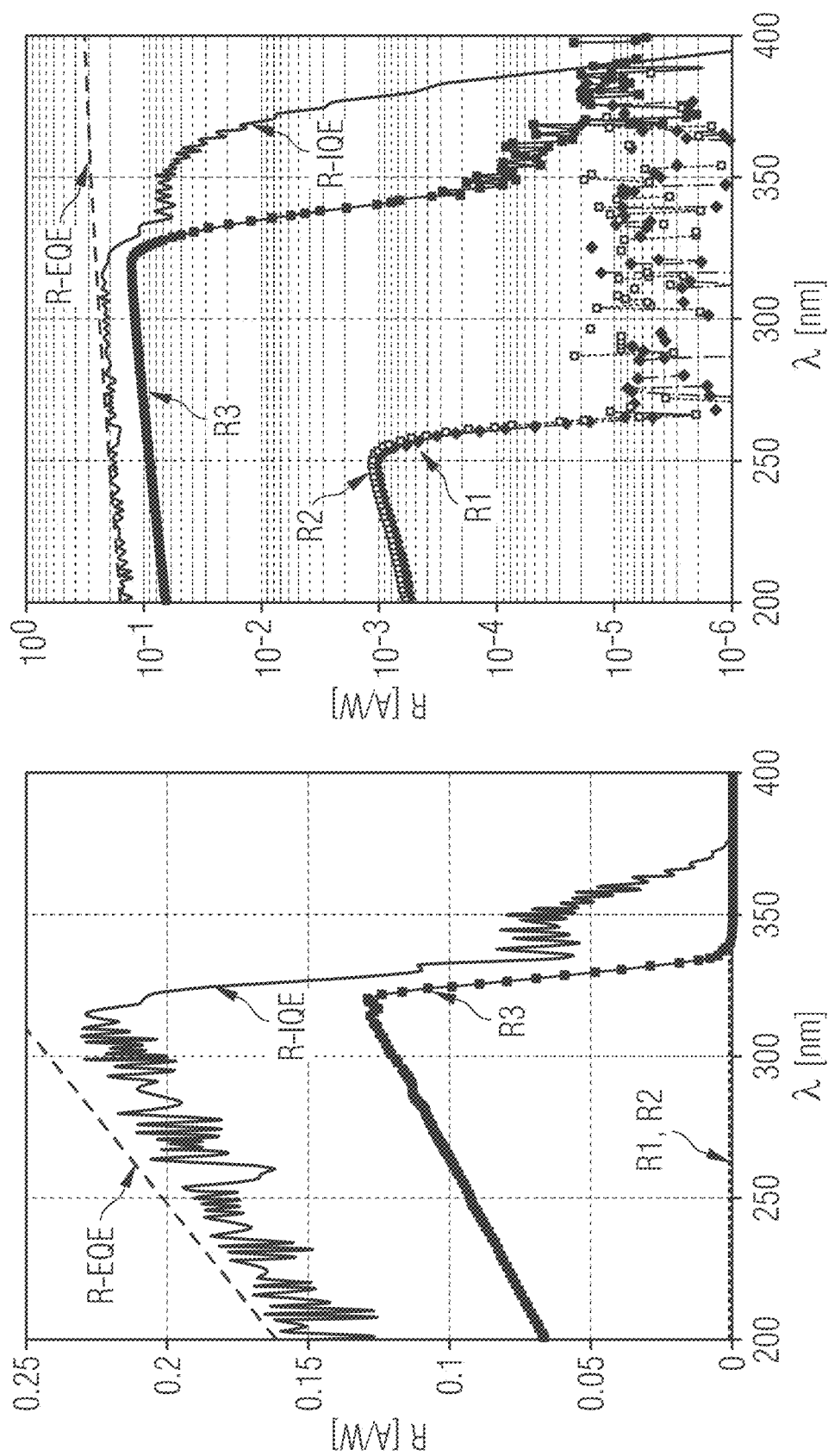

COMPONENT FOR DETECTING UV RADIATION AND METHOD FOR PRODUCING A COMPONENT

This patent application is a national phase filing under section 371 of PCT/EP2017/062784, filed May 26, 2017, which claims the priority of German patent application 10 2016 110 041.2, filed May 31, 2016, each of which is incorporated herein by reference in its entirety.

TECHNICAL FIELD

A component for detecting ultraviolet radiation (UV radiation) is specified. Furthermore, a method for producing a component for the detection of UV radiation is specified.

SUMMARY OF THE INVENTION

Embodiments provide a component for detecting UV radiation with improved quantum efficiency and increased sensitivity in the UV range. Further embodiments provide a cost-effective and simplified procedure for producing a component.

In at least one embodiment of a component for detecting ultraviolet radiation, it comprises a semiconductor body having a first semiconductor layer of a first charge carrier type, a second semiconductor layer of a second charge carrier type and an active layer located therebetween. The semiconductor body is based on $Al_mGa_{1-n-m}In_nN$ with $0 \leq n \leq 1$, $0 \leq m \leq 1$ and $n+m<1$. The active layer is formed in such a way that the ultraviolet radiation arriving during operation of the component is absorbed by the active layer to generate charge carrier pairs. The first semiconductor layer and the second semiconductor layer can be n-doped and p-doped, respectively, or vice versa. The active layer is preferably relaxed with respect to its lattice constant. The active layer and the first semiconductor layer may have different lattice parameters.

A lattice parameter of a layer is understood to mean in particular an actual lateral lattice spacing of this layer which can be found in a semiconductor body. A lattice constant of a layer is understood to mean a lateral lattice spacing of this layer in a completely relaxed state. The lattice constant is thus a material-specific quantity, while the lattice parameter depends on the state of the respective layer and can therefore take different values, for example, if the respective layer is partially strained, maximally strained or partially relaxed.

A lateral direction is generally understood to mean a direction that runs along, in particular parallel to a main extension plane, for instance parallel to a growth surface, of the active layer. A vertical direction, on the other hand, is understood to mean a direction which is transverse, in particular perpendicular to the main extension plane of the active layer. For example, the vertical direction is parallel to a growth direction of the semiconductor body. The vertical direction and the lateral direction are preferably perpendicular to each other.

It was surprisingly found that a particularly high built-in electrical field is achieved in the active layer when the active layer is relaxed with respect to its lattice constant. This contradicts the usual experience that relaxed layers form defects and thus show increased losses. The achievement of a high built-in electrical field in this case is due to the piezoelectric effect, in particular to the interaction between a spontaneous polarization field and the piezoelectric field within the active layer. In the piezoelectric effect, built-in electrical fields occur due to mechanical strains. The direction of the strain plays a decisive role for the piezoelectric fields and thus for the entire built-in electrical field in the active layer. If the active layer is strained with respect to its lattice constant, for instance compressively strained, the piezoelectric field generated within the active layer can counteract the spontaneous polarization field generated within the active layer, resulting in a weakening of the entire built-in electrical field in the active layer. On the other hand, if the active layer is relaxed with respect to its lattice constant, the piezoelectric field generated within the active layer is reduced, in particular to zero, resulting in a high overall electric field within the active layer.

Since the charge carriers in the form of electron-hole pairs generated as a result of the radiation absorption are separated by the built-in electrical field in the active layer in such a way that the electrons drift to the positive potential, for instance to the p-conducting second semiconductor layer, and the holes drift to the negative potential, for instance to the n-conducting first semiconductor layer, a high built-in electrical field in the active layer leads to a particularly efficient transport of the photo-electrically generated charge carriers, so that the efficiency and/or the sensitivity of the component are particularly increased.

According to at least one embodiment of the component, the first semiconductor layer is strained with respect to its lattice constant, for instance compressively strained. In particular, the first semiconductor layer directly adjoins the active layer. It is also possible for the active layer to be adjacent to a transition layer, wherein the transition layer is grown in particular pseudomorphically onto the first semiconductor layer. It was found that the amplification of the built-in electrical field within the active layer is additionally increased when the active layer is relaxed with respect to its lattice constant and simultaneously the first semiconductor layer is strained, preferably compressively strained, with respect to its lattice constant. In case of a compressive strain, lateral lattice spacings of the first semiconductor layer are compressed. The resulting piezoelectric field in the first semiconductor layer leads in particular to an additional amplification of the built-in electrical field within the active layer.

According to at least one embodiment of the component, the active layer is formed to be intrinsic. If the active layer is intrinsic, i.e., self-conducting, the active layer can be undoped or essentially undoped. An essentially undoped layer is understood to mean a layer which in particular shows traces of dopants or such a low dopant concentration that its properties are not or only insignificantly influenced by the doping. Due to the intrinsic active layer, the n-conducting first semiconductor layer does not directly adjoin the p-conducting second semiconductor layer, and when a reverse voltage is applied, compared to conventional diodes, this results in the formation of a larger space charge zone in which photons are absorbed for generating charge carrier pairs.

The component is thus preferably formed as a UV detector, in particular having a PIN (positive-intrinsic-negative) diode structure or having a PIN transition. For example, the component is a PIN diode. The active layer is formed for instance with regard to its material composition in such a way that UV radiation is absorbed by the active layer during operation of the component, which allows charge carriers to be generated in the form of electron-hole pairs in the active layer. If charge carriers of different electrical charges are generated in the active layer, for example, by radiation absorption, detector signals can be generated in the form of electrical signals, when different charge carriers drift into the first or the second semiconductor layer depending on their electrical charges. The photons entering the active layer are thus converted into an electric current by the internal photoelectric effect. Alternatively, it is also conceivable that the active layer is weakly doped. A weakly doped layer is generally understood to be a layer having a dopant concentration of less than $10^{18}$ cm$^{-3}$, in particular less than $10^{17}$ cm$^{-3}$.

According to at least one embodiment of the component, the second semiconductor layer is strained with respect to its lattice constant or at least in regions, for example, along a lateral direction, has the same lattice parameter as the active layer. At least on its surface facing the active layer, the second semiconductor layer may have a lattice parameter which corresponds, is identical or substantially identical to a lattice parameter or a lattice constant of the active layer. Preferably, the second semiconductor layer is strained with respect to the active layer, for instance tensil-strained. In this case, the mechanically relaxed active layer is arranged between two mechanically strained semiconductor layers, preferably between the compressively strained first semiconductor layer and the tensil-strained second semiconductor layer, as a result of which the built-in electrical field in the active layer is additionally increased. In particular, the active layer is in direct mechanical contact with both the first and second semiconductor layers.

A compressively strained layer is generally understood to mean a layer whose material-specific lattice constant is greater than the actual lateral lattice spacing, i.e., the lattice parameter, of the respective layer in the semiconductor body. A tensil-strained layer is generally understood to mean a layer whose material-specific lattice constant is smaller than the actual lateral lattice spacing, i.e., the lattice parameter, of the respective layer in the semiconductor body.

According to at least one embodiment of the component, the active layer has a degree of relaxation of at least 0.3, for instance of at least 0.5, in particular of at least 0.7 or preferably of at least 0.9.

A degree of relaxation G of a layer A is understood to mean in particular an absolute value of a quotient of the relative lateral lattice mismatch Gl=(al−af)/af and the relaxed lattice mismatch Gr=(ar−af)/af, namely G=|Gl/Gr|=|(al−af)/(ar−af)|, wherein al is the lattice parameter of the layer A along the lateral direction, for instance along a growth surface of the layer A; ar is the lattice constant of layer A, i.e., the lattice parameter of layer A in the completely unstrained or completely relaxed state; and af is a reference lattice spacing for determining the degree of relaxation of the layer A, wherein the reference lattice spacing is in particular a lattice parameter or a lattice constant of a layer on which the layer A is grown. For example, the reference lattice spacing can be the lattice constant of a growth substrate, the lattice parameter or lattice constant of a buffer layer or of a layer directly adjoining the layer A. In case of doubt, af can be assumed to be the lattice parameter of that layer onto which the layer A is directly applied.

The degree of relaxation thus indicates the degree to which the mechanical strains are relaxed within the respective layer. In case of complete relaxation, i.e., G=1, al and ar are identical. At maximum strain, for example, in case of pseudomorphic growth, i.e., G=0, al takes the value of the reference lattice spacing af. In the latter case, the lattice structure of the respective layer is maximally distorted along the lateral direction, so that the mechanical strain in the respective layer is highest.

Preferably, the active layer is completely relaxed. Further preferably, the first and/or the second semiconductor layer/s are/is maximally or essentially maximally strained with respect to their lattice constant. In other words, their degree of relaxation G can be zero or close to zero. In such cases, the piezoelectric fields can be particularly amplified for instance at interfaces between the active layer and the adjacent semiconductor layers, resulting in a correspondingly high field strength of the built-in electrical field in the active layer. However, it is also possible for the first and/or the second semiconductor layer to be partially strained and to have a degree of relaxation in particular smaller than 0.5, for instance smaller than 0.3, preferably smaller than 0.2 or smaller than 0.1.

According to at least one embodiment of the component, the semiconductor body is based on $Al_mGa_{1-n-m}In_nN$ with $0 \le n \le 1$ m=0. In particular, the first semiconductor layer is an n-doped GaN layer, the active layer is an intrinsic InGaN layer and the second semiconductor layer is a p-doped GaN layer. The semiconductor body can be formed as a buffer layer on a pure GaN layer.

According to at least one embodiment of the component, the first semiconductor layer and the active layer are each based on $Al_mGa_{1-n-m}In_nN$ with $0 \le n \le 1$, $0 < m \le 1$ and n+m<1. For example, the active layer is based on AlGaN or on AlGaInN. The aluminum content of the active layer determines in particular a cut-off wavelength of the sensitive spectral range of the component. As the aluminum content increases, the cut-off wavelength is shifted in the direction of a shorter wavelength. If indium is added to the active layer, the cut-off wavelength is shifted in the direction of a longer wavelength. If the active layer contains both aluminum and indium, the cut-off wavelength of the sensitive spectral range can be adjusted in a simplified and precise manner. UV detectors based on AlGaN or AlGaInN are particularly preferred over conventional silicon photodiodes, since even without external filters, they are insensitive to visible light and/or infrared light. In addition, such components show little or no degradation when exposed to UV light. In particular, the component described here is free of external filters, for instance free of filters outside the semiconductor body.

It was found that the spontaneous polarization field depends in particular on the aluminum content of the individual layers of the semiconductor body. At the same time, the aluminum content has influences on the conduction and/or valence band edges of the semiconductor layers and thus also on the Fermi levels of the semiconductor layers. The differences in the Fermi levels in turn contribute to the increase of the built-in electrical field within the active layer. For adjusting the Fermi levels, the semiconductor layers can also be highly n- and p-doped, respectively.

In the following, further exemplary embodiments of the component having different preferred configurations with regard to aluminum content, layer thicknesses and/or doping of the layers of the semiconductor body are specified, which, inter alia, are particularly suitable for additionally increasing the built-in electrical field in the active layer.

According to at least one embodiment of the component, the first semiconductor layer has a higher aluminum content than the active layer. In this case, both the first semiconductor layer and the active layer can contain aluminum. In particular, the Al content is given as m in $Al_mGa_{1-m}N$ or in $Al_mGa_{1-n-m}In_nN$ with $0 \le n \le 1$, $0 \le m \le 1$ and n+m≤1. For example, the Al content m in the active layer is between 5% and 30% inclusive, for instance between 10% and 20% inclusive. The Al content in the first semiconductor layer can be between 20% and 80% inclusive, for instance between 30% and 60% inclusive, or between 40% and 60% inclusive. With such a high aluminum content, the semiconductor layer can have a sufficiently large electrical transverse conductivity, so that a current spreading layer, which is located for instance directly on the first semiconductor layer, can be dispensed with. Furthermore, a first contact for electrically contacting the first semiconductor layer can be formed or arranged directly on the first semiconductor layer.

According to at least one embodiment of the component, the first semiconductor layer and the active layer are each based on $Al_mGa_{1-n-m}In_nN$ with $0 \leq n \leq 1$, $0 < m \leq 1$ and $n+m<1$, wherein the first semiconductor layer has a higher aluminum content than the active layer. For example, both the first semiconductor layer and the second semiconductor layer are based on AlGaN. Preferably, the first semiconductor layer has an aluminum content that is higher than the aluminum content of the second semiconductor layer, for instance twice or at least three times as high as the aluminum content of the second semiconductor layer.

According to a variant of one embodiment of the component, the active layer is based on AlGaN or on AlGaInN. In particular, the first semiconductor layer has an aluminum content which is at least twice or three times as high as an aluminum content of the second semiconductor layer and/or of the active layer. The active layer and the second semiconductor layer may contain substantially the same amount of aluminum. However, it is also possible that the aluminum contents of the active layer and of the second semiconductor layer differ from each other by at most 50%, for example, by at most 30% or by at most 10%.

In particular, the second semiconductor layer has an aluminum content between 0% and 15% inclusive, for instance between 5% and 15% inclusive, or between 5% and 10% inclusive. For example, a vertical layer thickness of the second semiconductor layer is between 5 nm and 60 nm inclusive, for instance between 10 nm and 60 nm inclusive, or between 10 nm and 30 nm inclusive. The component has a radiation entry surface that is preferably formed on a p-doped side of the component, for instance on the side of the p-doped second semiconductor layer. Due to the comparatively small layer thickness of the second semiconductor layer, UV radiation can pass through the second semiconductor layer to the active layer without significant absorption losses. Alternatively or additionally, the component may have one or one further radiation entry surface formed on an n-doped side of the component, for instance on the side of the n-doped first semiconductor layer. Due to the comparatively high aluminum content in the n-doped first semiconductor layer, UV radiation can pass through the first semiconductor layer to the active layer without significant absorption losses, even if the layer thickness is greater than that of the second semiconductor layer.

According to at least one embodiment of the component, the active layer and the first semiconductor layer are formed with respect to their layer thicknesses and aluminum contents in such a way that the first semiconductor layer remains strained with respect to its lattice constant and the active layer is at least partially relaxed with respect to its lattice constant. In particular, the active layer has a greater layer thickness and/or a lower aluminum content than the first semiconductor layer. The relaxation of the active layer can be obtained by suitable adjustment of growth parameters. If, however, the active layer is sufficiently thick, the relaxation of the active layer can be obtained in a simplified manner, in particular by forming so-called slip lines (German: Gleitlinien).

According to at least one embodiment of the component, the second semiconductor layer has a smaller layer thickness than the first semiconductor layer. The second semiconductor layer may also have a lower aluminum content and/or a higher doping concentration than the first semiconductor layer. Preferably, the thickness of the first semiconductor layer is formed such that it acts as a filter layer for those proportions of the radiation to be detected which have energies higher than the band gap of the active layer. The band gap of the active layer depends in particular on its aluminum and indium contents and determines in particular the so-called cut-off wavelength of the sensitive spectral range of the component. For example, the first semiconductor layer acts as a filter layer for radiation proportions having wavelengths smaller than 250 nm, or smaller than 200 nm, or at least for radiation proportions having wavelengths for instance between 100 nm and 250 nm. For example, the first semiconductor layer is an n-doped AlGaN-based layer having a layer thickness between 50 nm and 800 nm inclusive, for instance between 50 nm and 300 nm inclusive, for instance between 100 nm and 300 nm inclusive, or between 200 nm and 300 nm inclusive.

According to at least one embodiment of the component, the semiconductor body is grown, for instance epitaxially deposited, on a buffer structure. In particular, the buffer structure is arranged between the semiconductor body and a carrier of the component such as a growth substrate made of silicon or sapphire, for example. The first semiconductor layer adjoins for instance the buffer structure. The buffer structure is preferably undoped. The buffer structure can be based on $Al_mGa_{1-m}N$ with $0 \leq m \leq 1$. The buffer structure can be free of aluminum or aluminum-containing. In particular, the buffer layer has a higher aluminum content than the first semiconductor layer. Preferably, the first semiconductor layer is grown on the buffer layer in such a way that the first semiconductor layer is strained with respect to the buffer layer or to the carrier regarding the lattice constant. In particular, the first semiconductor layer and the buffer structure have the same lattice parameter at least at their common interface. The first semiconductor layer is preferably grown pseudomorphically on the buffer structure and is thus maximally strained with respect to the buffer structure. Apart from this, it is also conceivable that the first semiconductor layer is only partially strained with respect to the buffer layer or to the carrier.

According to at least one embodiment of the component, it is formed in such a way that an aluminum content, in particular an average aluminum content, decreases monotonously from the buffer structure towards the second semiconductor layer via the first semiconductor layer and the active layer. In case of such configuration of the course of aluminum content, a component having a high crystal quality and a long service life can be produced in a simplified manner. Such a configuration also ensures the realization of an increased built-in electrical field in the active layer.

According to at least one embodiment of the component, the carrier of the component is radiation-transmissive. The component may have a radiation-transmissive contact layer, which is formed in particular from a transparent electrically conductive oxide. The semiconductor body is arranged in the vertical direction for instance between the carrier and the contact layer. Both the carrier and the contact layer can each have a radiation passage surface for the electromagnetic radiation to be detected. Via this radiation passage surface, which serves in particular as the radiation entry surface of the component, UV radiation can be coupled into the active layer and absorbed there. In particular, the first semiconductor layer is located between the active layer and the carrier.

According to at least one embodiment of the component, it has a transition layer for instance made of AlGaN and located between the first semiconductor layer and the active layer. The first semiconductor layer is preferably an n-doped AlGaN layer. The active layer can be an intrinsic AlGaN layer or an AlGaInN layer. Preferably, the transition layer is intrinsic and can have an aluminum content that is at least twice as high as an aluminum content of the active layer. In particular, the transition layer has a thickness which is at most 30%, for instance at most 20% or at most 10% and in particular at least 5% or 3% of a layer thickness of the active layer. Preferably, the transition layer is strained, in particular maximally strained with respect to the first semiconductor layer. The transition layer and the active layer may have the same material composition. However, they may contain different aluminum contents. The aluminum contents in the transition layer and in the first semiconductor layer are preferably the same or differ from each other by at most 50%, 40%, 30%, 20% or by at most 10%. In the presence of the transition layer, a high crystal quality of the semiconductor body can be achieved, wherein the transition layer can serve as a current spreading layer for the active layer due to its higher aluminum content. In contrast to this, the transition layer, however, may be optional.

According to at least one embodiment of the component, the buffer structure is of multi-layered fashion. In particular, the buffer structure has sublayers having different material compositions. For example, the buffer layer contains a first sublayer from AlN and a second sublayer from AlGaN. In particular, the first sublayer is arranged vertically between the carrier and the second sublayer. For example, during the manufacture of the component, the second sublayer is deposited on the first sublayer.

In at least one embodiment of a method for producing a component, a growth substrate is provided. A buffer structure is applied onto the growth substrate. A semiconductor body comprising a first semiconductor layer, an active layer and a second semiconductor layer is applied onto the buffer structure in the layer order mentioned above. Regarding its layer thickness, choice of material or by suitable adjustment of growth parameters such as pressure and temperature, the active layer is formed on the first semiconductor layer in particular in such a way that, with respect to its lattice constant, the active layer is relaxed in particular with respect to the first semiconductor layer or to the buffer structure and/or to the growth substrate. Analogously, for example, regarding its layer thickness, choice of material or by suitable adjustment of growth parameters such as pressure and temperature, the first semiconductor layer can be formed on the buffer structure in such a way that, with respect to its lattice constant, the first semiconductor layer is strained, in particular compressively strained, in particular with respect to the buffer structure and/or to the growth substrate.

According to at least one embodiment of the method, the buffer structure and the semiconductor body are epitaxially deposited onto the growth substrate. A predetermined degree of relaxation of the active layer can be achieved by adjusting the layer thickness of the respective layer and/or by adjusting the growth parameters. Preferably, the active layer is relaxed by the formation of so-called misfit-dislocations (German: Misfit-Versetzungen) already during the growing process.

This so-called plastic relaxation can first be thermally activated, whereby misfit-dislocations are generated by the formation of slip lines. The macroscopic behavior at advanced relaxation can be investigated by means of X-ray topography or X-ray diffractometry, for example, wherein the layer thickness and the deviation of the lattice parameter of the respective layer from the buffer structure or from the growth substrate can be measured. The degree of relaxation of the respective layers can be determined from the deviation of the lattice parameter. Further methods for the reduction of strain are also conceivable, for example, the formation of ripples or inter-diffusion on the growth surface of an epitaxial layer.

According to at least one embodiment of the method, the growth substrate is radiation-transmissive. The first semiconductor layer is in particular an n-doped semiconductor layer, wherein the thickness of the first semiconductor layer is formed in such a way that it acts as a filter for the radiation proportions having energies higher than the band gap of the active layer, for example, for the radiation proportions having wavelengths in particular smaller than 250 nm or smaller than 220 nm or smaller than 200 nm.

The method described above is particularly suitable for the production of a component described above. The features described in connection with the component can therefore also be used for the method, and vice versa.

BRIEF DESCRIPTION OF THE DRAWINGS

Further advantages, preferred embodiments and further developments of the component and of the method will become apparent from the exemplary embodiments explained in the following in connection with FIGS. 1A to 5.

FIG. 1A shows an exemplary embodiment of a component in a schematic sectional view;

FIG. 1B shows an exemplary embodiment of a component in a plan view;

FIG. 2A shows a schematic illustration of the lattice arrangement in the case of homo-epitaxy;

FIG. 2B shows a schematic illustration of the lattice adjustment in the case of hetero-epitaxy;

FIG. 2C shows a schematic illustration of the lattice relaxation in the case of hetero-epitaxy;

FIG. 3 shows the course of the E-field strength along a vertical direction with different configurations of the semiconductor body;

FIG. 4 shows a simulation of the responsivity (German: Stromempfindlichkeit) of the component in the case of front-side detection.

Figure 5:
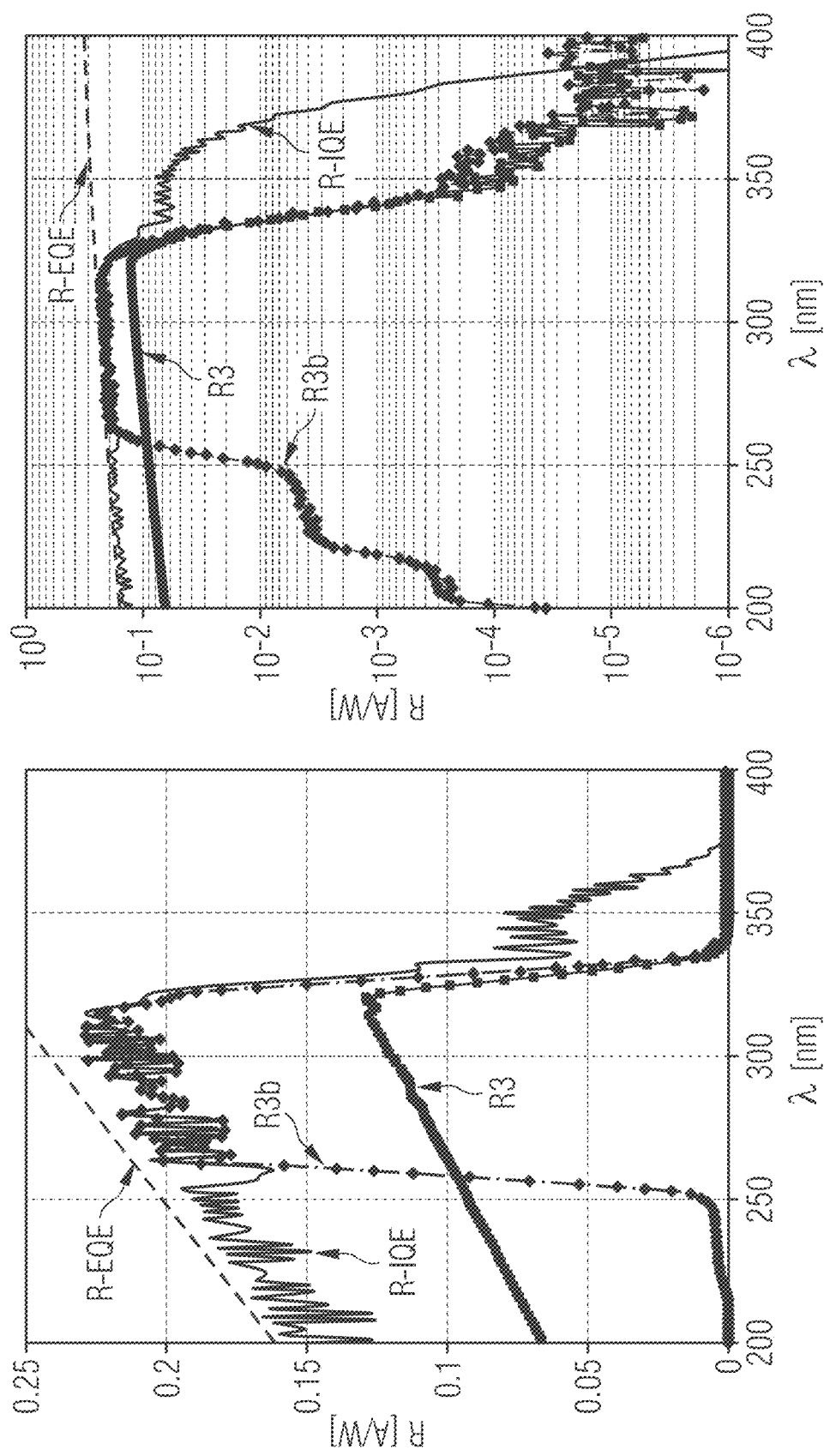
FIG. 5 shows a simulation of the responsivity of the component in the case of backside detection.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

The component 100 comprises a carrier 1 and a semiconductor body 2 arranged on the carrier. In the vertical direction, a buffer structure 3 is arranged between the carrier 1 and the semiconductor body 2. The carrier 1 is a growth substrate, for example, a sapphire substrate. The carrier 1 is preferably radiation-transmissive. The component 100 has a contact layer 5 on a surface of the semiconductor body 2 facing away from the carrier 1. A first contact 41 and a second contact 42 for electrically contacting the component 100 are arranged in particular directly on the first semiconductor layer 1 and on the contact layer 5, respectively. The component 100 has a front side 101 and a rear side 102 facing away from the front side. In FIG. 1A, the front side 101 is defined by a free-standing surface 51 of the contact layer 5. The rear side 102 is formed by a freestanding surface 11 of the carrier 1. The component 100 is formed especially as a UV detector chip. Both the carrier 1 and the contact layer 5 can each have a radiation passage surface 11 or 51 for the electromagnetic radiation to be detected.

The semiconductor body 2 comprises a first semiconductor layer 21 having a layer thickness T1, a second semiconductor layer 22 having a layer thickness T2 and an active layer 23 having a layer thickness T3 arranged between the first and second semiconductor layers. The first semiconductor layer 21 and the second semiconductor layer 22 are in particular n- and p-doped, respectively. The active layer 23 is preferably intrinsic, i.e., self-conducting. The active layer 23 is configured for instance for the detection of electromagnetic radiation. In particular, the component 100 comprising the second semiconductor layer 22, the active layer 23 and the first semiconductor layer 21 has a p-i-n diode structure. Preferably, the semiconductor body has a III-V semiconductor material or consists thereof. For example, the first semiconductor layer 21 and/or the second semiconductor layer 22 and/or the active layer 23 have a semiconductor layer based on AlGaN or AlGaInN.

The semiconductor body 2 comprises a transition layer 24 having a layer thickness T4. The transition layer 24 is in particular an intrinsic AlGaN layer. The transition layer 24 may have a higher aluminum content than the active layer 23. The transition layer 24 is arranged vertically between the first semiconductor layer 21 and the active layer 23. However, the transition layer 24 can also be optional.

Furthermore, the semiconductor body 2 comprises a connection layer 25 having a layer thickness T5 between the second semiconductor layer 22 and the contact layer 5, wherein the connection layer 25 can be a p-type semiconductor layer, such as a p-doped GaN layer. A homogeneous current distribution in the second semiconductor layer 22 can be achieved by means of the connection layer 25. In particular, the connection layer 25 and the second semiconductor layer 22 are in direct mechanical contact.

The buffer layer 3 has a first sublayer 31 and a second sublayer 32 as shown in FIG. 1A. The buffer layer 3 is preferably undoped. The sublayers of the buffer layer 3 may have different material compositions and/or different aluminum contents. In particular, the first sublayer 31 disposed between the carrier 1 and the second sublayer 32 has a higher aluminum content than the second sublayer 32. For example, the first sublayer 31 is an AlN layer and the second sublayer 32 is an AlGaN layer.

Especially preferably, the contact layer 5 contains a transparent conductive oxide (TCO). Transparent conductive oxides are transparent conductive materials, usually metal oxides such as zinc oxide, tin oxide, cadmium oxide, titanium oxide, indium oxide or indium tin oxide (ITO). In particular, the contact layer 5 consists of indium tin oxide. Deviating from FIG. 1A, it is also possible for the component 100 to be free of a contact layer made of a transparent conductive oxide. In this case, the connection layer 25 can be formed with regard to its doping and/or material selection in such a way that the connection layer 25 acts as a contact layer and/or as a current spreading layer for the second semiconductor layer 22.

FIG. 1B schematically shows the component 100 in a plan view of its front side 101. In a plan view, the semiconductor body 2 may have an opening in which the first contact 41 is arranged. The opening extends along the vertical direction in particular from the front side 101 through the connection layer 25, the second semiconductor layer 22, the active layer 23, the transition layer 24 into the first semiconductor layer 21. In all lateral directions, the opening and thus also the first contact 41 are surrounded by the semiconductor body 2. The first contact 41 has a first contact point and a first contact finger which has an elongated basic shape and, along a lateral direction, extends away from the contact point. To obtain a uniform current distribution, the first contact finger may have a length that is for instance at least 30%, 50% or at least 70% of a width or length of a surface of the front side 101 of the component 100.

The second contact 42 is U-shaped and encloses the first contact 41 at least in regions. In FIG. 1B, the second contact 42 has a contact point and two further contact fingers extending laterally away from the contact point. For obtaining a uniform current distribution, the further contact fingers may each have a length that is for instance at least 30%, 50% or 70% of the width or length of the front side 101 of the component 100. The contact fingers can each have a width that is, for example, between 1% and 5% of the width or length of the front side 101 of the component 100. For example, the width of a contact finger is between 3 μm and 10 μm, inclusive. The contacts 41 and 42 together preferably cover at most 10%, at most 5% or at most 3% of the front side of the component 100. In contrast to FIG. 1B, it is also possible for the first contact 41 and/or the second contact 42 to have other shapes.

According to a variant of the embodiment, the first semiconductor layer 21 and the active layer 23 can be formed in such a way that the first semiconductor layer 21 is n-doped and, regarding its lattice constant, is strained with respect to the buffer structure 3. The first semiconductor layer 21 and the buffer structure 3 may have the same lattice parameter, for instance the same lateral lattice parameter. For example, the first semiconductor layer 21 can be applied pseudomorphically and epitaxially to the buffer layer 3. In this case, the first semiconductor layer 21 is maximally strained with respect to the lattice structure 3. It is possible that the first semiconductor layer 21, the transition layer 24 and the buffer structure 3 or at least the second sublayer 32 of the buffer structure 3 have the same lateral lattice parameter. It is also possible that the first semiconductor layer 21 is strained only partially with respect to the buffer structure 3. In this case, the first semiconductor layer 21 and the buffer structure 3 may have different lattice parameters.

Regarding its lattice constant, the active layer 23 is relaxed, preferably completely relaxed, with respect to the first semiconductor layer 21 and/or with respect to the buffer structure 3. Regarding its lattice constant, the second semiconductor layer 22 may be relaxed with respect to the first semiconductor layer 21 and/or with respect to the buffer structure 3. The second semiconductor layer 22 and/or the connection layer 25, however, may be strained, in particular maximally strained with respect to the intrinsic active layer 23.

FIGS. 2A to 2C show exemplary lattice arrangements, particularly along a growth boundary surface indicated by the BB' line.

In case of homo-epitaxy, wherein the same material is grown on top of each other, the lattice parameters of adjacent layers are identical along both vertical and lateral directions, as shown in FIG. 2A. The lattice parameter usually corresponds to the material-specific lattice constant of the respective layer, so that no mechanical strain occurs within these layers.

In case of hetero-epitaxy, wherein two different materials are grown on top of each other, strain can occur. As shown in FIG. 2B, two different layers may have the same lateral lattice parameter in case of pseudomorphic growth. Due to the lattice adjustment, in FIG. 2B, the crystal structure of the upper layer is compressed according to the crystal structure of the lower layer along the lateral directions. While the vertical lattice parameter is usually compressed or distorted by transverse contraction according to Poisson's law, the lateral lattice parameter of the upper layer is adapted to the lattice parameter or the lattice constant of the lower layer. The upper layer is thus strained (German: verspannt), in particular compressively strained.

FIG. 2C shows that the upper layer is relaxed (German: relaxiert) due to defect formation at the growth boundary surface. Usually in case of complete relaxation, both the vertical and lateral lattice parameters correspond to the material-specific lattice constant of the respective layer.

FIG. 3 shows different field strength curves of the built-in electrical field E along a vertical direction Y in cases of different configurations of the semiconductor body 2. More precisely, FIG. 3 shows simulated field strength curves C1, C2 and C3 for a component 100 having the following configuration:

| layer | material | thickness | Al-content [%] | doping | concentration [$*10^{19}$ cm$^{-3}$] |
|---|---|---|---|---|---|
| 25 | GaN | 20 nm | 0 | p-doped | 1.8 |
| 22 | AlGaN | 30 nm | 20 | p-doped | 1.8 |
| 23 | AlGaN | 250 nm | 20 | intrinsic | |
| 24 | AlGaN | 20 nm | 60 | intrinsic | |
| 21 | AlGaN | 265 nm | 60 | n-doped | 1.2 |
| 32 | AlGaN | 115 nm | 80 | none | |
| 31 | AlN | 110 nm | 100 | none | |
| 1 | Sapphire | 82 µm | 0 | none | |

In this case, the component 100 has a lateral width of about 500 µm and a lateral length of about 830 µm, wherein for representing the curves C1, C2 and C3, as shown in FIG. 3, the field strength is determined along a cut line DD' being laterally spaced from an edge of the component 100 by about 158 µm. The curve C1 shows the course of the field strength along the vertical direction Y in the case that the first semiconductor layer 21, the transition layer 24, the active layer 23 and the second semiconductor layer 22 are strained with respect to the first buffer layer 31. The curve C2 shows the course of the field strength along the vertical direction Y in the case that the first semiconductor layer 21, the transition layer 24, the active layer 23 and the second semiconductor layer 22 are relaxed. The curve C3 shows the course of the field strength along the vertical direction Y in the case that the first semiconductor layer 21 and the transition layer 24 are compressively strained with respect to the first buffer layer 31, the second semiconductor layer 22 is tensil-strained with respect to the active layer 23, while the active layer 23 is completely relaxed.

The curves shown in FIG. 3 clearly show that the strain and the relaxation of the individual layers of the semiconductor body 2 have a significant influence on the field strength and on the field strength distribution of the built-in electrical field in the region of the active layer 23. Within the active layer 23 (see the zoom of this region in FIG. 3), the built-in electrical field has an average value of $-2.96*10^3$ V/cm for C1, an average value of $1.17*10^4$ V/cm for C2, and an average value of $1.26*10^5$ V/cm for C3. In the case of C1, due to the unfavorable orientation of the field, the transport of photo-electrically generated charge carriers, i.e., of electron-hole pairs, towards the corresponding semiconductor layers, is rather hindered by the built-in electrical field. In the case of C3, wherein the first semiconductor layer 21 is strained and the active layer 23 is relaxed, the average value of the built-in electrical field in the region of the active layer 23 is increased by an order of magnitude compared to the case of C2, i.e., by a factor of about 10. This leads to a particularly efficient transport of the charge carriers generated in the active layer 23, resulting in an increased sensitivity of the component 100.

Linearly on the left and logarithmically on the right, FIG. 4 shows various simulations of the responsivity R (German: Stromempfindlichkeit) of the component 100 with respect to the wavelength λ in case of a front-side detection of UV radiation, namely via the front side 101.

FIG. 4 shows a curve R-IQE of the theoretical responsivity when the internal quantum efficiency (IQE) is 100%, a curve R-EQE of the theoretical responsivity when the external quantum efficiency (EQE) is 100%, and the curves R1, R2 and R3 of the responsivity of the component 100, each as a function of the wavelength λ. For the simulation of the curves R1, R2 and R3, the same parameters were used as for the curves C1, C2 and C3 shown in FIG. 3. The contact layer 5 was not taken into account in the simulation.

The curves R1, R2 and R3 clearly show that a high responsivity R of the component 100 is obtainable at wavelengths smaller than 350 nm, in particular smaller than 325 nm, only in the case of curve R3, wherein the first semiconductor layer 21 is strained and the active layer 23 is relaxed. In the case of curve R3, the responsivity R reaches for instance 50% of the theoretically best possible value. This is due to the high field strength of the built-in electrical field in the region of the active layer 23.

In the other cases of R1 and R2, wherein the first semiconductor layer 21, the second semiconductor layer 22 and the active layer 23 are either all strained or all relaxed, the responsivity R of the component 100—as shown by the curves R1 and R2—is strongly reduced, apparently due to the low field strength of the built-in electrical field in the region of the active layer 23.

Linearly on the left and logarithmically on the right, FIG. 5 shows a simulation of the responsivity R3 of the component 100 in the case of front-side detection of UV radiation and a simulation of the responsivity R3b of the component 100 in the case of rear-side detection of UV radiation, i.e., via the rear side 102.

The curve R3 shown in FIG. 5 for the responsivity of the component 100 in case of front-side detection corresponds to the curve R3 shown in FIG. 4. The curve R3b showing the responsivity of the component 100 in the case of rear-side detection shows that the component 100 can be configured as a narrow-band photodetector for UV radiation. This effect arises from the configuration of the first semiconductor layer, namely of the n-doped AlGaN layer, as a filter layer for shorter wavelengths, in this case for wavelengths shorter than 250 nm. Thus, a narrow-band photodetector having a responsivity width of for instance 100 nm can be realized.

FIG. 5 also shows that, compared to the front-side detection, in the case of rear-side detection, the component 100 has a higher responsivity at wavelengths between about 250 nm and 350 nm. This effect can be explained by the fact that in the case of rear-side detection, the UV radiation does not have to pass through the second semiconductor layer 22 and the connection layer 25, i.e., through the p-doped GaN and p-doped AlGaN, and thereby is partially absorbed. In order to obtain a narrow-band UV detector having an improved efficiency, it is therefore conceivable that the component 100 is formed in such a way that the coupled electromagnetic radiation first passes through the first p-doped semiconductor layer 21 for instance made of AlGaN before it gets absorbed by the active layer 23 for generating charge carrier pairs. It is therefore also possible that the growth substrate 1 is removed from the semiconductor body 2 or is thinned in such a way that the component 100 is free or essentially free of the growth substrate. In this case, the component can be formed as a thin-film detector chip or as a detector flip-chip.

The sensitivity and efficiency of a component can be significantly increased by forming a relaxed and especially intrinsic active layer and/or a mechanically strained and doped semiconductor layer in particular adjoining the active layer. Due to the improved sensitivity and efficiency, the component can be manufactured to be smaller and more compact and, in particular, in a more cost-effective manner. If the semiconductor layer is formed also as a filter, for example, for high-energy proportions of the electromagnetic radiation to be detected, the wavelength selectivity of the component can be adjusted in such a way that the component is formed as a narrow-band detector.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A component for detecting ultraviolet radiation comprising:
   a semiconductor body comprising a first semiconductor layer of a first charge carrier type, a second semiconductor layer of a second charge carrier type and an intermediate active layer located therebetween,
   wherein the semiconductor body is based on $Al_mGa_{1-n-m}In_nN$ with $0 \le n \le 1$, $0 \le m \le 1$ and $n+m<1$,
   wherein the first semiconductor layer is n-doped,
   wherein the second semiconductor layer is p-doped,
   wherein the active layer is formed with respect to its material composition in such a way that during operation of the component, arriving ultraviolet radiation is absorbed by the active layer for generating charge carrier pairs,
   wherein the active layer is relaxed with respect to its lattice constant, and
   wherein the first semiconductor layer is strained with respect to its lattice constant.

2. The component according to claim 1, wherein the component is a UV detector chip, and wherein the first semiconductor layer has a degree of relaxation of less than 0.5 and the active layer has a degree of relaxation of at least 0.3.

3. The component according to claim 1,
   wherein, for increasing a built-in electrical field, the first semiconductor layer is compressively strained with respect to an underlying buffer layer,
   wherein the second semiconductor layer is tensil-strained with respect to the active layer, and
   wherein the relaxed active layer is arranged between the compressively strained first semiconductor layer and the tensil-strained second semiconductor layer.

4. The component according to claim 1, wherein the active layer is intrinsic.

5. The component according to claim 1, wherein the first semiconductor layer is compressively strained with respect to its lattice constant.

6. The component according to claim 1, wherein the second semiconductor layer is strained with respect to its lattice constant or at least regionally has the same lattice parameter as the active layer.

7. The component according to claim 1, wherein the active layer is completely relaxed.

8. The component according to claim 1, wherein both the first semiconductor layer and the second semiconductor layer are based on $Al_mGa_{1-n-m}In_nN$ with $0 \le n \le 1$, $0<m \le 1$ and $n+m<1$, and wherein the first semiconductor layer has a higher aluminum content than the active layer.

9. The component according to claim 1, wherein both the first semiconductor layer and the second semiconductor layer are based on $Al_mGa_{1-n-m}In_nN$ with $0 \le n \le 1$, $0<m \le 1$ and $n+m<1$, and wherein the first semiconductor layer has a higher aluminum content than the second semiconductor layer.

10. The component according to claim 1, wherein the first semiconductor layer, the second semiconductor layer and the active layer are each based on $Al_mGa_{1-n-m}In_nN$ with $0 \le n \le 1$, $0<m \le 1$ and $n+m<1$, and wherein an aluminum content of the first semiconductor layer is at least twice as high as an aluminum content of the second semiconductor layer and/or of the active layer.

11. The component according to claim 1, wherein the active layer and the first semiconductor layer are formed with respect to their layer thicknesses and aluminum contents in such a way that the first semiconductor layer remains strained with respect to its lattice constant and the active layer is at least partially relaxed with respect to its lattice constant, and wherein the active layer has a greater layer thickness and/or a lower aluminum content than the first semiconductor layer.

12. The component according to claim 1, wherein the second semiconductor layer has a lower layer thickness, a lower aluminum content and a higher doping concentration than the first semiconductor layer.

13. The component according to claim 1,
   wherein the semiconductor body is grown on a buffer structure,
   wherein the first semiconductor layer adjoins the buffer structure,
   wherein the buffer structure is based on $Al_mGa_{1-m}N$ with $0 \le m \le 1$ and is undoped, and
   wherein, at least at their common interface, the first semiconductor layer and the buffer structure have the same lateral lattice parameter.

14. The component according to claim 13, wherein an average aluminum content decreases monotonously from the buffer structure towards the second semiconductor layer via the first semiconductor layer and the active layer.

15. The component according to claim 1, further comprising
   a radiation-transmissive carrier; and
   a radiation-transmissive contact layer,
   wherein the semiconductor body is arranged between the carrier and the contact layer,
   wherein the contact layer comprises a transparent electrically conductive oxide, and wherein the carrier and the contact layer each have a radiation passage surface of the component.

16. The component according to claim 1, wherein the first semiconductor layer is an n-doped AlGaN layer, wherein the active layer is an intrinsic AlGaN layer or AlGaInN layer, wherein a transition layer made of AlGaN or AlGaInN is disposed between the first semiconductor layer and the active layer, wherein the transition layer is intrinsic, wherein an aluminum content of the transition layer is at least twice as high as an aluminum content of the active layer, and wherein the transition layer has a layer thickness which is at most 30% of a layer thickness of the active layer.

17. A method for producing a component according to claim 1, the method comprising:

applying a buffer structure on a growth substrate; and applying the semiconductor body having the first semiconductor layer, the active layer and the second semiconductor layer on the buffer structure in the mentioned order, wherein the active layer is formed on the first semiconductor layer such that the active layer is relaxed with respect to its lattice constant and the first semiconductor layer is strained with respect to its lattice constant.

18. The method according to claim 17, wherein the buffer structure and the semiconductor body are deposited epitaxially on the growth substrate, and wherein a predetermined degree of relaxation of the active layer is obtained by adjusting its layer thickness and/or by adjusting growth parameters.

19. The method according to claim 17, wherein the growth substrate is radiation-transmissive, and wherein the first semiconductor layer is formed with respect to its layer thickness in such a way that it acts as a filter for radiation proportions having energies higher than a band gap of the active layer.

* * * * *